US010300807B2

(12) United States Patent
Jin et al.

(10) Patent No.: US 10,300,807 B2
(45) Date of Patent: May 28, 2019

(54) SYSTEMS AND METHODS FOR STATE OF CHARGE AND CAPACITY ESTIMATION OF A RECHARGEABLE BATTERY

(71) Applicants: Johnson Controls Technology Company, Plymouth, MI (US); Johnson Controls Advanced Power Solutions GmbH, Hannover OT (DE)

(72) Inventors: Zhihong H. Jin, Pewaukee, WI (US); Christian Kuper, Barsinghausen (DE); Perry M. Wyatt, Fox Point, WI (US)

(73) Assignees: Johnson Controls Technology Company, Auburn Hills, MI (US); Johnson Controls Advanced Power Solutions GmbH, Hannover (DE)

(*) Notice: Subject to any disclaimer, the term of this patent is extended or adjusted under 35 U.S.C. 154(b) by 244 days.

(21) Appl. No.: 15/254,645

(22) Filed: Sep. 1, 2016

(65) Prior Publication Data

US 2017/0225584 A1    Aug. 10, 2017

Related U.S. Application Data

(60) Provisional application No. 62/291,109, filed on Feb. 4, 2016.

(51) Int. Cl.
*B60L 11/18* (2006.01)
*G01R 31/36* (2019.01)
(Continued)

(52) U.S. Cl.
CPC ......... *B60L 11/1861* (2013.01); *B60L 3/0038* (2013.01); *B60L 3/0046* (2013.01); *B60L 3/12* (2013.01); *B60L 11/1857* (2013.01); *G01R 31/367* (2019.01); *G01R 31/3651* (2013.01); *G01R 31/3679* (2013.01); *G01R 31/392* (2019.01); *B60L 2240/547* (2013.01); (Continued)

(58) Field of Classification Search
CPC .. B60L 11/1861; B60L 3/0038; B60L 3/0046; B60L 11/1857; B60L 3/12; B60L 2240/549; B60L 2240/547; B60L 2260/44; B60L 2240/80; G01R 31/3679; G01R 31/3651; G01R 31/3606; Y10S 903/951
USPC ................................. 324/426, 149; 320/132
See application file for complete search history.

(56) References Cited

U.S. PATENT DOCUMENTS 7,982,433 B2 * 7/2011 Lim ..................... G01R 31/361
                                                                320/132
8,615,372 B2   12/2013 Tomura et al.
(Continued)

OTHER PUBLICATIONS

PCT/US2017/018909 International Search Report and Written Opinion dated Jun. 9, 2017.

*Primary Examiner* — Farhana A Hoque
(74) *Attorney, Agent, or Firm* — Fletcher Yoder P.C.

(57) ABSTRACT

A battery system may include a battery that in operation couples to an electrical system, and a battery control module that in operation electrically couples to the battery. The battery control module may read battery data, estimate a state of charge of the battery based at least in part on the battery data, and estimate a state of charge error of the battery based on magnitudes of state of charge error sources. Additionally, the battery control module may update a state of health estimation of the battery when the state of charge error of the battery exceeds a predetermined threshold.

23 Claims, 7 Drawing Sheets

(51) Int. Cl.
_G01R 31/367_ (2019.01)
_G01R 31/392_ (2019.01)
_B60L 3/00_ (2019.01)
_B60L 3/12_ (2006.01)

(52) U.S. Cl.
CPC ..... _B60L 2240/549_ (2013.01); _B60L 2240/80_ (2013.01); _B60L 2260/44_ (2013.01); _G01R 31/3606_ (2013.01); _Y02T 10/705_ (2013.01); _Y02T 10/7011_ (2013.01); _Y02T 10/7044_ (2013.01); _Y10S 903/951_ (2013.01)

(56) References Cited

U.S. PATENT DOCUMENTS

| | | |
|---|---|---|
| 8,918,300 B2 | 12/2014 | Baba et al. |
| 9,026,389 B2 | 5/2015 | Shigemizu et al. |
| 9,575,130 B2 | 2/2017 | Rueger et al. |
| 2010/0138178 A1 | 6/2010 | Paryani et al. |
| 2011/0148424 A1 | 6/2011 | Chiang et al. |
| 2015/0134282 A1 | 5/2015 | Soga et al. |
| 2015/0331055 A1 | 11/2015 | Oi et al. |

* cited by examiner

SYSTEMS AND METHODS FOR STATE OF CHARGE AND CAPACITY ESTIMATION OF A RECHARGEABLE BATTERY

CROSS-REFERENCE

This application claims priority from and the benefit of U.S. Provisional Application Ser. No. 62/291,109, entitled "DUAL DIRECTIONAL CAPACITY AND STATE OF CHARGE ESTIMATION," filed Feb. 4, 2016, which is hereby incorporated by reference in its entirety for all purposes.

BACKGROUND

The present disclosure generally relates to the field of batteries and battery modules. More specifically, the present disclosure relates to estimating states of charge and capacities of a rechargeable battery.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operate at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

In addition to use in vehicles (e.g., cars, boats, trucks, motorcycles, airplanes), advances in battery technology and rechargeable batteries are more frequently being used it what may be referred to as stationary battery applications. Applications for stationary batteries, which are often used in backup or supplemental power generation, are becoming more widespread with improvements in rechargeable aspects of batteries and with the lowering of prices for such technology. For example, stationary batteries may be utilized for industrial and/or household applications. Such applications may include DC power plants, substations, back-up power generators, transmission distribution, solar power collection, and grid supply.

As technology continues to evolve, there is a need to provide improved state and capacity indicators for battery modules of such vehicles, stationary battery applications or systems, and other battery systems. For example, the electric power used by the xEVs or stationary battery applications may be provided by rechargeable batteries. It may be difficult to accurately depict a state of charge or capacity of the rechargeable batteries while the rechargeable batteries are in operation. The present disclosure is generally related to estimating real-time parameters of a rechargeable battery during operation of the rechargeable battery, battery system, and/or the xEV.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to a battery system. The battery system may include a battery that in operation couples to an electrical system, and a battery control module that in operation electrically couples to the battery. The battery control module may read battery data, estimate a state of charge of the battery based at least in part on the battery data, and estimate a state of charge error of the battery based on magnitudes of state of charge error sources. Additionally, the battery control module may update a state of health estimation of the battery when the state of charge error of the battery exceeds a predetermined threshold.

The present disclosure also relates to a tangible, non-transitory computer readable medium of a battery control module that stores instructions executable by a processor. The instructions may include instructions to cause the processor to read battery data of a rechargeable battery, estimate a state of charge of the rechargeable battery based at least in part on the battery data read from the rechargeable battery, and determine a state of charge error of the state of charge based at least in part on magnitudes of state of charge error sources. Additionally, the instructions may include instructions to update a state of health of the rechargeable battery when the state of charge error exceeds a predetermined threshold.

The present disclosure also relates to an energy storage system. The energy storage system may include an electrical system of a vehicle or stationary battery, and an energy storage component that electrically couples to the electrical system of the vehicle or stationary battery. The energy storage system may also include at least one sensor coupled to the energy storage component that collects energy storage component data from the energy storage component and a battery control module. The battery module may estimate a state of charge of the energy storage component based on the energy storage component data collected by the at least one sensor, estimate a state of charge error of the battery based at least in part on magnitudes of state of charge error sources, and update a state of health estimation of the battery when the state of charge error of the battery exceeds a predetermined threshold.

DRAWINGS

Various aspects of this disclosure may be better understood upon reading the following detailed description and upon reference to the drawings in which.

Figure 7:
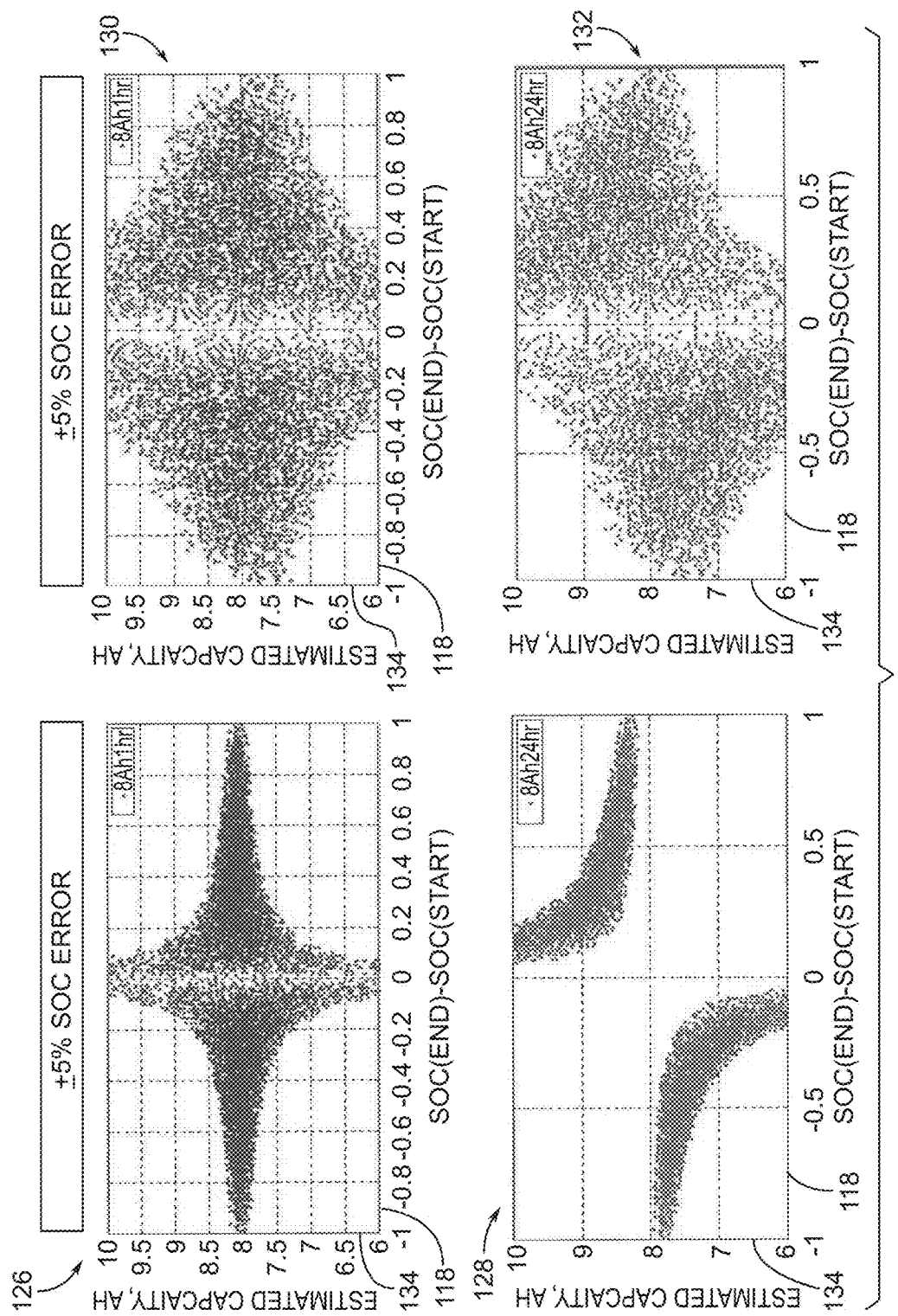
Figure 8:
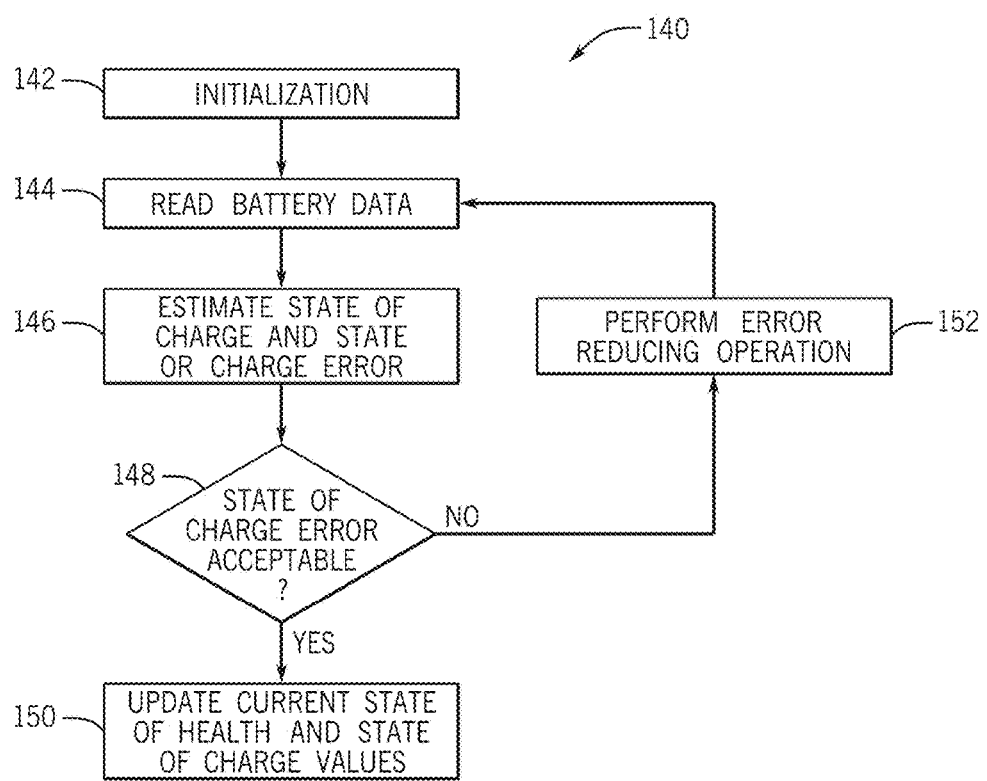

FIG. 7 is a set of cross plots representing an estimated capacity of an energy storage component over a state of charge operating range for various state of charge error values and times, in accordance with an embodiment of the present approach; and FIG. 8 is a process flow diagram describing a method for updating a state of charge and a state of health of an energy storage component, in accordance with an embodiment of the present approach.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). Such battery systems may include one or more battery modules, each battery module having a number of battery cells (e.g., lithium-ion (Li-ion) electrochemical cells) arranged and electrically interconnected to provide particular voltages and/or currents useful to power, for example, one or more components of an xEV. As another example, battery modules in accordance with present embodiments may be incorporated with or provide power to stationary power systems (e.g., non-automotive systems).

Based on the advantages over traditional gas-power vehicles, manufactures, which generally produce traditional gas-powered vehicles, may desire to utilize improved vehicle technologies (e.g., regenerative braking technology) within their vehicle lines. Often, these manufacturers may utilize one of their traditional vehicle platforms as a starting point. Accordingly, since traditional gas-powered vehicles are designed to utilize 12 volt battery systems, a 12 volt lithium ion battery may be used to supplement a 12 volt lead-acid battery. More specifically, the 12 volt lithium ion battery may be used to more efficiently capture electrical energy generated during regenerative braking and subsequently supply electrical energy to power the vehicle's electrical system.

As advancements occur with vehicle technologies, high voltage electrical devices may also be included in the vehicle's electrical system. For example, the lithium ion battery may supply electrical energy to an electric motor in a mild-hybrid vehicle. Often, these high voltage electrical devices utilize voltage greater than 12 volts, for example, up to 48 volts. Accordingly, in some embodiments, the output voltage of a 12 volt lithium ion battery may be boosted using a DC-DC converter to supply power to the high voltage devices. Additionally or alternatively, a 48 volt lithium ion battery may be used to supplement a 12 volt lead-acid battery. More specifically, the 48 volt lithium ion battery may be used to more efficiently capture electrical energy generated during regenerative braking and subsequently supply electrical energy to power the high voltage devices.

Thus, the design choice regarding whether to utilize a 12 volt lithium ion battery or a 48 volt lithium ion battery may depend directly on the electrical devices included in a particular vehicle. Nevertheless, although the voltage characteristics may differ, the operational principles of a 12 volt lithium ion battery and a 48 volt lithium ion battery are generally similar. More specifically, as described above, both may be used to capture electrical energy during regenerative braking and subsequently supply electrical energy to power electrical devices in the vehicle.

Accordingly, to simplify the following discussion, the present techniques will be described in relation to a battery system with a 12 volt lithium ion battery and a 12 volt lead-acid battery. However, one of ordinary skill in art is able to adapt the present techniques to other battery systems, such as a battery system with a 48 volt lithium ion battery and a 12 volt lead-acid battery.

The present disclosure relates to batteries and battery modules. More specifically, the present disclosure relates to estimating real-time parameters of rechargeable batteries. Particular embodiments are directed to lithium ion battery cells that may be used in vehicular contexts (e.g., hybrid electric vehicles) as well as other energy storage/expending applications (e.g., energy storage for an electrical grid).

With the preceding in mind, the present disclosure describes techniques for estimating real-time parameters of the rechargeable batteries. Traditionally, a rated capacity of a rechargeable battery may be determined by completely discharging the rechargeable battery from a fully charged state using a constant discharge rate at room temperature. Such a method may not be practical for rechargeable batteries used in vehicular contexts or stationary battery applications. Accordingly, a partial discharge of the rechargeable battery may be used to estimate a capacity of the rechargeable battery. A battery control module described in the present disclosure may estimate the capacity and other parameters of the rechargeable battery in real-time or near real-time using the systems and methods described in detail below.

Figure 1:
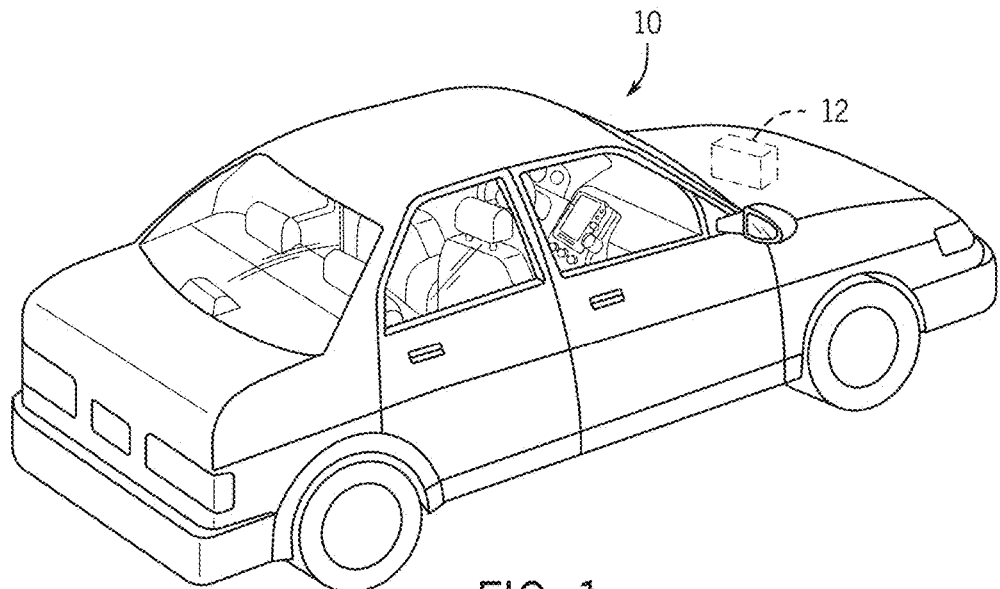
FIG. 1 is perspective view of a vehicle (an xEV) having a battery system contributing all or a portion of the power for the vehicle, in accordance with an embodiment of the present approach.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles. Further, the techniques described herein may also be adaptable to other high voltage energy storage/expending applications, such as stationary battery systems (e.g., electrical grid power storage systems).

As discussed above, it may be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
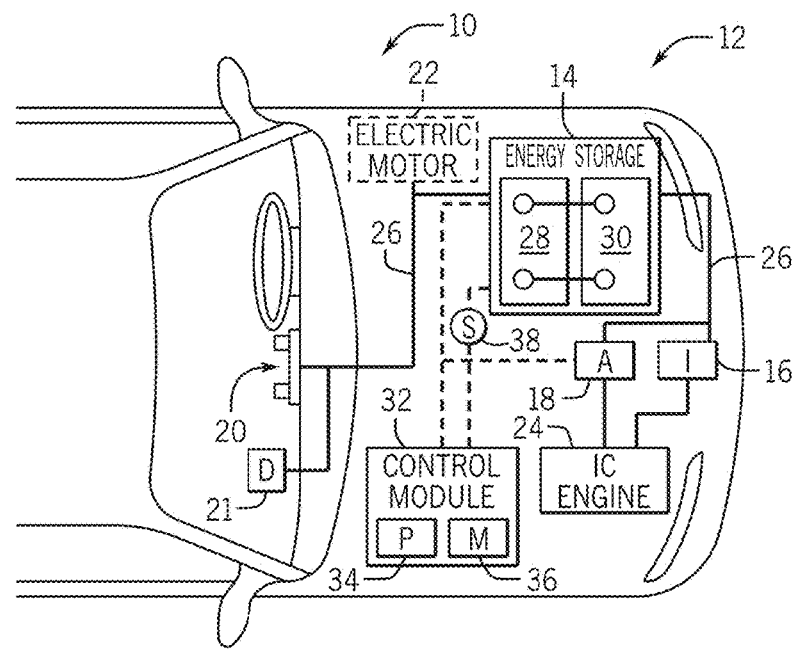
FIG. 2 is a cutaway schematic view of the xEV of FIG. 1 in the form of a hybrid electric vehicle (HEV), in accordance with an embodiment of the present approach.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 14 supplies power to the vehicle console 20, a display 21 within the vehicle, and the ignition system 16, which may be used to start (e.g., crank) an internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator 18 and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20. Accordingly, when a 12 volt battery system 12 is used, the bus 26 may carry electrical power typically between 8 and 18 volts.

Additionally, as depicted, the energy storage component 14 may include multiple battery modules. For example, in the depicted embodiment, the energy storage component 14 includes a lead acid (e.g., a first) battery module 28 in accordance with present embodiments, and a lithium ion (e.g., a second) battery module 30, where each battery module 28, 30 includes one or more battery cells. In other embodiments, the energy storage component 14 may include any number of battery modules. Additionally, although the first battery module 28 and the second battery module 30 are depicted adjacent to one another, they may be positioned in different areas around the vehicle. For example, the second battery module 30 may be positioned in or about the interior of the vehicle 10 while the first battery module 28 may be positioned under the hood of the vehicle 10.

In some embodiments, the energy storage component 14 may include multiple battery modules to utilize multiple different battery chemistries. For example, the first battery module 28 may utilize a lead-acid battery chemistry and the second battery module 30 may utilize a lithium ion battery chemistry. In such an embodiment, the performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32. More specifically, the control module 32 may control operations of components in the battery system 12, such as relays (e.g., switches) within energy storage component 14, the alternator 18, and/or the electric motor 22. For example, the control module 32 may regulate an amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, determine a predicted temperature trajectory of either battery module 28 or 30, determine predicted life span of either battery module 28 or 30, determine fuel economy contribution by either battery module 28 or 30, control magnitude of voltage or current output by the alternator 18 and/or the electric motor 22, and the like.

Accordingly, the control module 32 may include one or more processors 34 and one or more memories 36. More specifically, the one or more processors 34 may include one or more application specific integrated circuits (ASICs), one or more field programmable gate arrays (FPGAs), one or more general purpose processors, or any combination thereof. Generally, the processor 34 may perform computer-readable instructions related to the processes described herein. Additionally, the processor 34 may be a fixed-point processor or a floating-point processor.

The one or more memories 36 may include volatile memory, such as random access memory (RAM), and/or non-volatile memory, such as read-only memory (ROM), optical drives, hard disc drives, or solid-state drives. In some embodiments, the control module 32 may include portions of a vehicle control unit (VCU) and/or a separate battery control module. Additionally, as depicted, the control module 32 may be included separate from the energy storage component 14, such as a standalone module. In other embodiments, the battery management system 36 may be included within the energy storage component 14.

In certain embodiments, the control module 32 or the processor 34 may receive data from various sensors 38 disposed within and/or around the energy storage component 14. The sensors 38 may include a variety of sensors for measuring current, voltage, temperature, and the like regarding the battery module 28 or 30. After receiving data from the sensors 38, the processor 34 may convert raw data into estimations of parameters of the battery modules 28 and 30. As such, the processor 34 may render the raw data into data that may provide an operator of the vehicle 10 with valuable information pertaining to operations of the battery system 12, and the information pertaining to the operations of the battery system 12 may be displayed on the display 21. The display 21 may display various images generated by device 10, such as a GUI for an operating system or image data (including still images and video data). The display 21 may be any suitable type of display, such as a liquid crystal display (LCD), plasma display, or an organic light emitting diode (OLED) display, for example. Additionally, the display 21 may include a touch-sensitive element that may provide inputs to adjust parameters of the control module 32 or data processed by the processor 34.

The energy storage component 14 may have dimensions comparable to those of a typical lead-acid battery to limit modifications to the vehicle 10 design to accommodate the battery system 12. For example, the energy storage component 14 may be of similar dimensions to an H6 battery, which may be approximately 13.9 inches×6.8 inches×7.5 inches. As depicted, the energy storage component 14 may be included within a single continuous housing. In other embodiments, the energy storage component 14 may include multiple housings coupled together (e.g., a first housing including the first battery 28 and a second housing including the second battery 30). In still other embodiments, as mentioned above, the energy storage component 14 may include the first battery module 28 located under the hood of the vehicle 10, and the second battery module 30 may be located within the interior of the vehicle 10.

Figure 3:
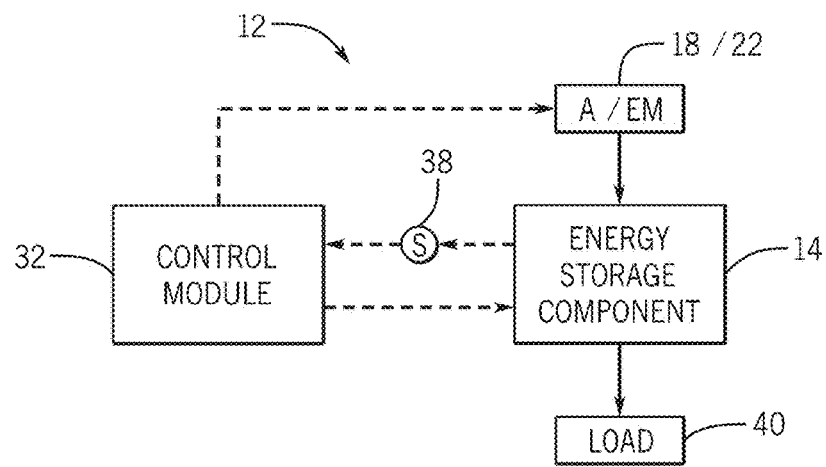
FIG. 3 is a schematic view of a battery system, such as that of the xEV of FIG. 1 or a stationary battery system, in accordance with an embodiment of the present approach.

More specifically, FIG. 3 illustrates a schematic view of components of the battery system 12. As mentioned above in the discussion of FIG. 2, the control module 32 may regulate an amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, determine a predicted temperature trajectory of either battery module 28 or 30, determine predicted life span of either battery module 28 or 30, determine fuel economy contribution by either battery module 28 or 30, control magnitude of voltage or current output by the alternator 18 and/or the electric motor 22, and the like. In particular, the control module 32 may enable measurement of the state of charge (SOC) and/or state of health (SOH) based on battery parameters measured by the sensors 38.

In some embodiments, the energy storage component 14 may include a single lithium ion cell or a plurality of lithium ion cells coupled in series. Additionally, present embodiments may include other rechargeable battery chemistries. The energy storage component 14 may discharge stored energy to a load 40, which may include the ignition system 16, the vehicle console 20, the display 21, the electric motor 22, and any other electric components of the vehicle 10. As the energy storage component 14 discharges the stored energy to the load 40, the alternator 18 and/or the electric motor 22 may provide energy to the energy storage component 14 to replenish the stored energy previously discharged to the load 40. The sensors 38 may measure battery parameters of the energy storage component 14, and the sensors 38 may transmit the measurements to the control module 32. The battery parameters of the energy storage component 14 may include terminal voltage measurements, terminal current measurements, and battery temperature measurements. The control module 32 processes the measured battery parameters, as described in detail below, to estimate the SOC of the energy storage component 14 and/or the state of health (SOH) (i.e., the capacity) of the energy storage component 14.

Further, it may be appreciated that the systems and methods described herein may be used for varying chemistries of the energy storage component 14. For example, the SOC and the SOH of the energy storage component 14 may represent a single or multi-cell lithium ion battery, a single or multi-cell lead-acid battery, some combination thereof (e.g., a lithium ion battery electrically coupled in parallel to a lead-acid battery), or any other single or multi-cell battery chemistries. Furthermore, in energy storage components 14 with multiple battery chemistries electrically coupled in parallel, the SOC and SOH may be determined for the entire energy storage component 14, or the SOC and SOH may be calculated for each of the multiple battery chemistries.

The SOC of the energy storage component 14 may be estimated through current integration, through open circuit voltage (OCV) measurements, and/or through recursive algorithms. For example, a current integration method may involve a time integration of an electric current, which results in a measurement of a change of the charge of the energy storage component 14 over a specified time period. However, the current integration method may be prone to current sensor inaccuracy, capacity degradation, and initial SOC estimation error. An OCV measurement may involve measuring the OCV of the energy storage component 14 when the energy storage component 14 is in a rest state, and consulting a look-up table that relates the OCV of the energy storage component 14 to the SOC of the energy storage component 14 (e.g., based on empirical data). Additionally, in some embodiments, the OCV measurement may be estimated during real-time using recursive algorithms. The OCV measurement method may be limited by voltage and temperature sensor accuracy in addition to an amount of down-time for the energy storage component 14 to reach a relaxed state to measure the true OCV value. Further, recursive algorithms may utilize equivalent circuit models and Kalman filters to recursively estimate the SOC. The recursive algorithms, however, may be exposed to error based on model inaccuracy and system noise. It may also be appreciated that the cell capacity of the energy storage component 14 may be estimated using various techniques such as a linear regression of real-time battery current and voltage using a Kalman filter and an equivalent circuit battery model. Additionally, the cell capacity of the energy storage component 14 may be determined by monitoring an open circuit voltage (OCV) of the energy storage component 14 of two operating points (SOC) and monitor the actual Ahr throughput between these points, and consulting a look-up table that relates the OCV to the SOH. The control module 32 may perform the cell capacity estimation for the energy storage component 14. Typically, the SOH of the energy storage component 14 may be calculated or characterized by monitoring a decrease in the cell capacity or an increase in cell resistance of the energy storage component 14.

Figure 4:
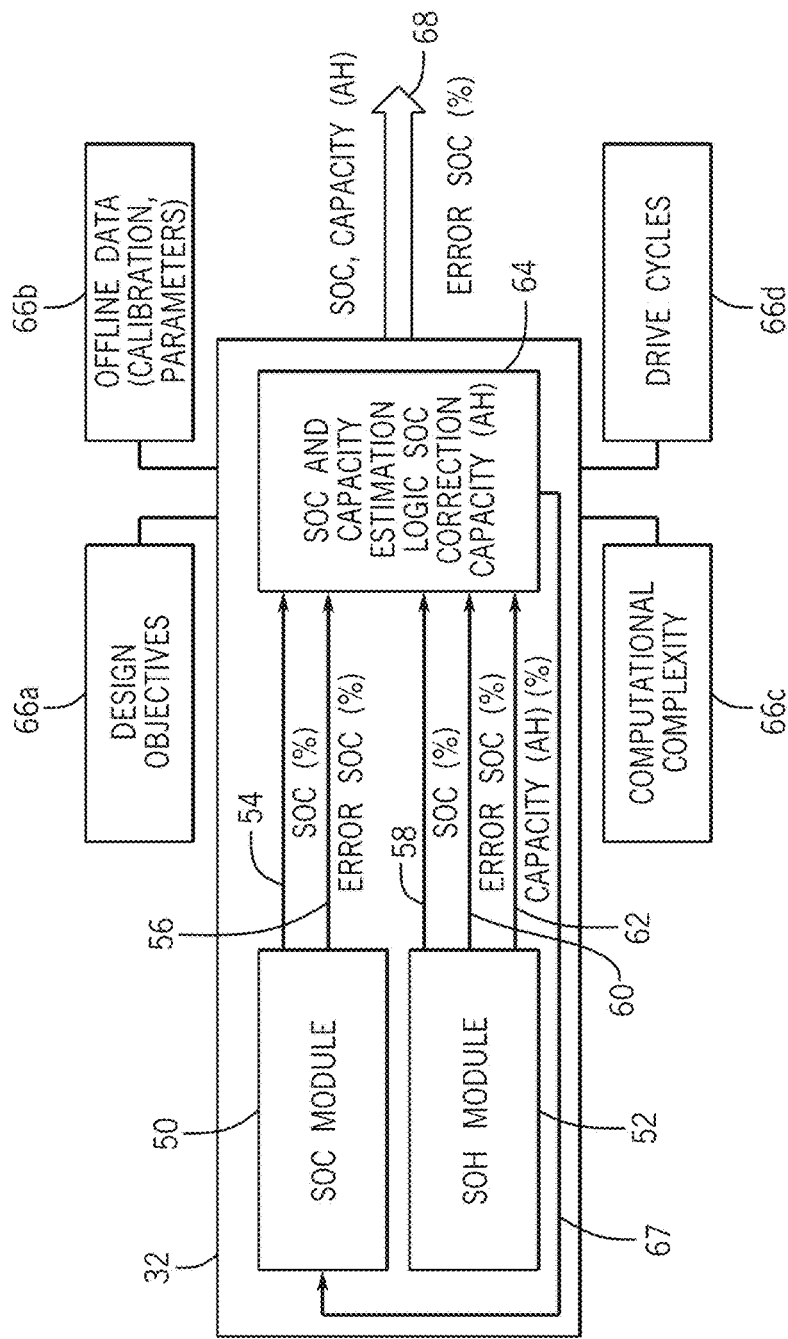
FIG. 4 is a block diagram of a control module of the battery system of FIG. 3, in accordance with an embodiment of the present approach.

Turning now to FIG. 4, a block diagram of the control module 32 is depicted. The control module 32 may include an SOC module 50 and an SOH module 52. Additionally, the SOC module 50 and the SOH module 52 may represent operations of instructions stored in the memory 36 of the control module 32 that are performed by the processor 34 of the control module 32. For example, the SOC module 50 may represent an operation that estimates the SOC of the energy storage component 14, which is represented by line 54. Additionally, the SOC module 50 may represent an operation that also estimates an SOC error of the SOC estimation, and the SOC error may be represented by the line 56. The SOC error may provide an indication as to how much uncertainty there is in the SOC estimation provided by the SOC module. As the SOC error percentage increases, an accuracy of the SOC estimation may decrease. Because the SOC estimation may be used, for example, as a fuel gauge of the energy storage device 14, accuracy of the SOC estimation may be useful for vehicles to maintain an accurate SOC estimation. Further, the SOH module 52 may provide a second estimate of the SOC of the energy storage component 14, which is represented by line 58, as a percentage of an initial SOC value of the energy storage component 14. Moreover, the SOH module 52 may also include an estimate of the SOC, which is represented by line 60, as a percentage of the SOC estimation, and which may be associated with the SOC estimate provided by the SOH module (line 58).

The SOC estimate provided by the SOC module 50 (line 54) may be obtained through a different method than the SOC estimate provided by the SOH module 52 (line 58). For example, the SOC estimate provided by the SOC module 50 may be obtained by a an integration estimation and the SOC estimate provided by the SOH module may be calculated based on an open circuit voltage (OCV) measurement. In this example, a SOC module 50 may implement the integral method by calculating the current estimate of SOC (line 54) as $SOC_t^{integral}=SOC_{t0}^{integral}+\int_{t0}^{t}f(I_t)dt$, i.e., the state of charge is estimated based on an initial state of charge value and an integration of a function of currents measured since the previous calculation. An SOH module 52 implementing an OCV measurement method may calculate the SOC (line 58) based on a relaxation of a value $SOC_{t0}^{OCV}$ (SOC measured when the battery was in equilibrium). In some implementations, this relaxation may be implemented via a Kalman filter. Additionally, the SOH module 52 may also provide an estimation of the capacity of the energy storage component 14 in ampere hours (Ah), which is represented by line 62. It should be noted that other methods to estimate the SOC of the energy storage component 14 may be implemented. Additionally, note that the SOH module 52 may also provide an estimation of the capacity of the energy storage component 14 in ampere hours (Ah), which is represented by line 62.

The SOC and Capacity values represented by the lines 54, 56, 58, 60, and 62 may all be provided to an SOC and Capacity estimation logic module 64 to obtain an improved SOC estimate and an improved estimate of the SOC error (arrow 58). The estimation logic module 64 may identify how much weight it should give to each of the received values for SOC (lines 54 and 58) based on the associated error estimates (lines 56 and 60, respectively). Moreover, the SOC and Capacity estimation logic module 64 may take into account design objectives 66a, offline data 66b (e.g., energy storage component 14 calibration and parameters), desired computational complexity 66c of the SOC and SOH estimations, and drive cycles 66d of the vehicle 10 in its calculation. The result may be that the estimation logic module 64 determines when to update values of the SOC and/or SOH based on the SOC and SOH error estimations provided by lines 56 and 60.

Accordingly, when a predetermined threshold of the SOC error estimates (line 56) is exceeded, the estimation logic module 64 may provide an indication of an SOC correction capacity, via line 67, to the SOC module 50 to minimize the SOC error provided to the estimation logic module 64. For example, when the SOC errors provided to the estimation logic module 64 is greater than a threshold percentage of 5 percent, the control module 32 may perform an error reducing operation on the SOC module 50 to reduce a value of the SOC error. In other embodiments, the threshold percentage may be 1 percent, 10 percent, or 15 percent. In some embodiments, an operation by the estimation logic module 64 may be triggered by when the difference between the state of charge estimates from SOC module (line 54) and the SOH module (line 58) are above a certain threshold, which may be 1, 5, 10, or 15 percent. In other embodiments, the operation may be the estimation logic module 64 may be triggered when a depth of discharge (difference between the current estimate of the SOC and the initial estimate of SOC) is above a threshold, which may be 10, 20, 50, 60, or 80 percent.

In some embodiments, the error reducing operation may include updating the estimation of the energy storage component by the SOH module and/or adjusting the SOC estimation techniques to account for variables that affect the SOC accuracy. Additionally or alternatively, the estimation logic module 64 may also output, via line 68, current SOC estimations, capacity estimations, and SOC error values. For example, the control module 32 may instruct the display 21 to display the output values represented by the line 68. Further, the memory 36 may store the output values represented by the line 68 as the current SOC and SOH estimations of the energy storage component 14 for potential use in determining subsequent SOC and SOH estimations and errors.

Figure 5:
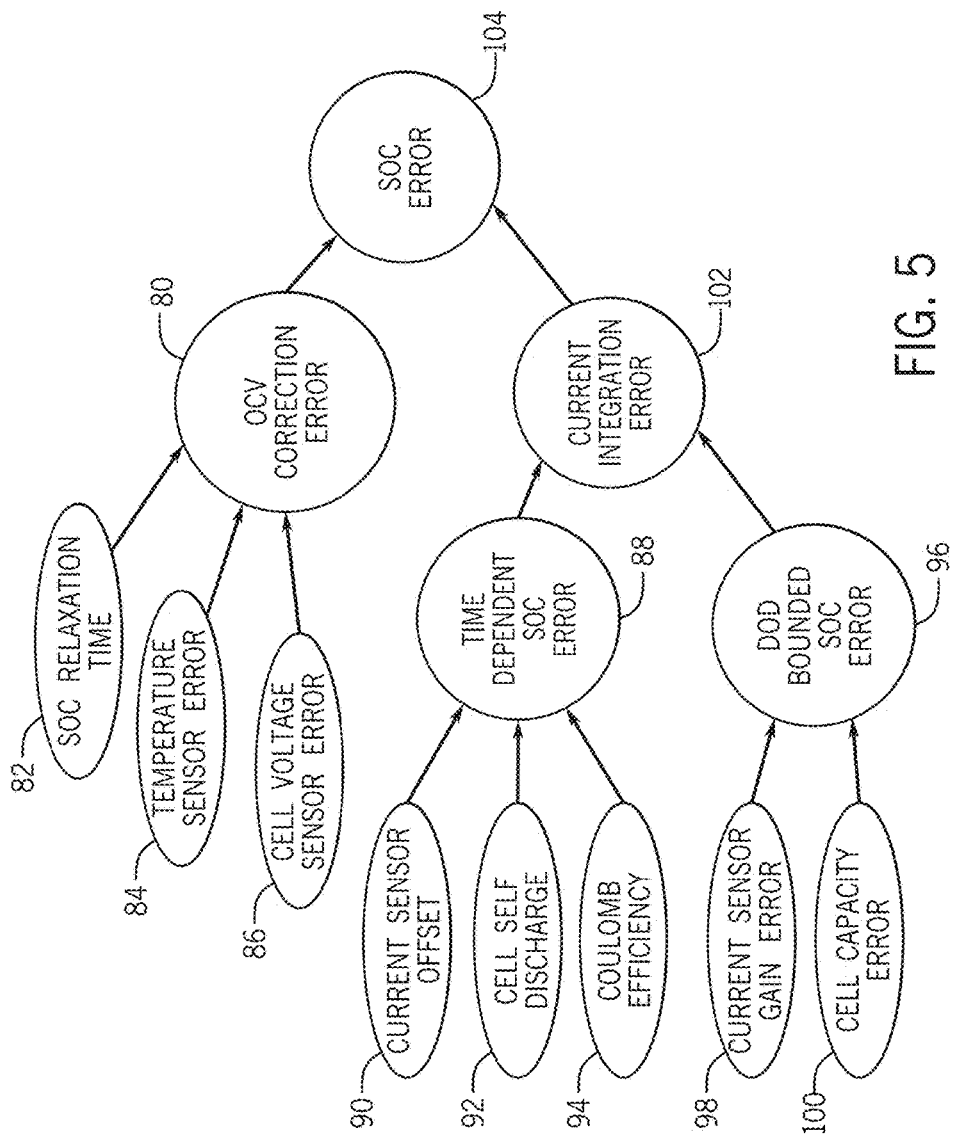
FIG. 5 is a block diagram of sources of error for SOC estimation, in accordance with an embodiment of the present approach.

FIG. 5 is a block diagram of sources of error for the SOC estimation described above in the discussion of FIG. 4. There are many variable that can affect the accuracy of an SOC estimation. Such variables may include voltage output, current output, temperature, rest time, cell capacity, coulomb efficiency, self-discharge, parasitic draw, and cell balancing current of the energy storage component 14, among others. The sources of error for the SOC estimation may generally be divided into specific error types, which correspond with specific phenomena and sensor error sources. A first group of error types is an open circuit voltage (OCV) correction error 80. The OCV correction error 80 may generally be characterized by randomly distributed error, which is based on magnitudes of various SOC error sources. For example, a magnitude of the OCV correction error 80 may be influenced by an SOC relaxation time 82 (e.g., how much time the energy storage component 14 has without an attached load before an OCV measurement is taken), a temperature sensor error 84, a cell voltage sensor error 86, or any other error source that would have an effect on an accuracy of the OCV of the energy storage component 14. The OCV correction error 80 may affect modules that implement an OCV method to estimate a SOC.

Another group of error types is a time-dependent SOC error 88. The time-dependent SOC error 88 may result from magnitudes of SOC error sources such as a current sensor offset 90, a cell self-discharge 92, or a coulomb efficiency 94 of the energy storage component 14. These error sources may be enhanced as a greater amount of time passes between SOC estimations. That is, the value of the error attributed to the time dependent SOC error 88 may accumulate with time. Accordingly, to minimize the time-dependent SOC error 88, the SOC estimations may be frequently updated.

Additionally, a depth of discharge (DOD) (i.e., SOC operating range) bounded SOC error 96 may provide another error source. The DOD bounded SOC error 96 may be a result of magnitudes of SOC error sources such as current sensor gain error 98 and cell capacity (SOH) error 100. It may be appreciated that the DOD bounded SOC error 96 and the time-dependent SOC error 88 both add together to represent a current integration error 102. Current integration errors may affect modules that implement integration methods to estimate an SOC.

In embodiments that may obtain different methods to estimate the SOC, each method may be associated to an error. For example, in a system that implements OCV method in a module and current integration method in a second module, the OCV correction error 80 and the current integration error 102 may add together to form the SOC error 104, which may represent the entirety of the SOC error of an SOC estimation of the energy storage component 14. However, by obtaining the two estimates separately estimating the errors individually, the overall SOC estimate error may be reduced, by weighting each SOC estimate according to its associated error, as described above.

Figure 6:
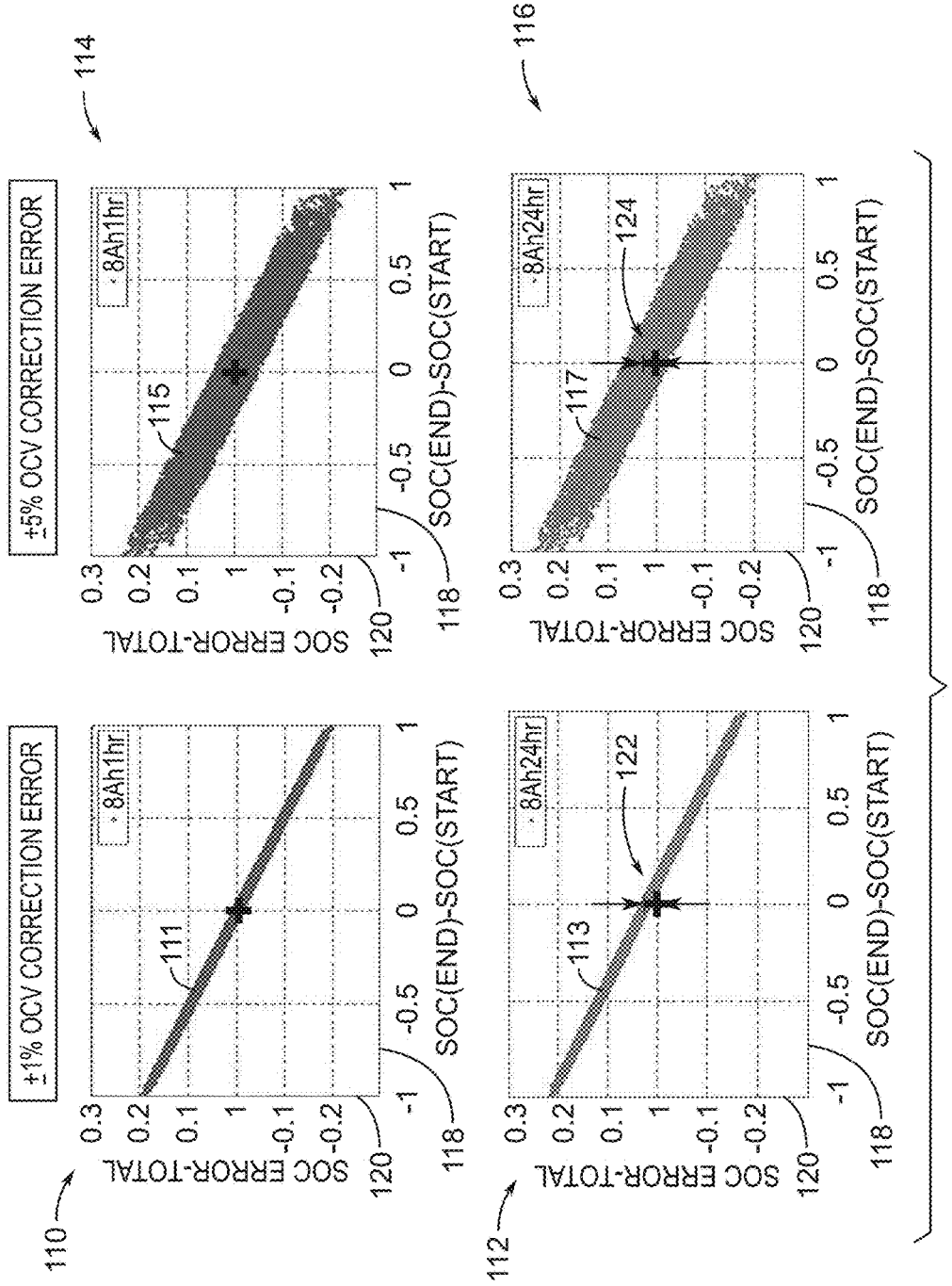
FIG. 6 is a set of cross plots representing an state of charge error of an energy storage component over a state of charge operating range for various open circuit voltage correction errors and times, in accordance with an embodiment of the present approach.

FIG. 6 is a set of cross plots representing an SOC error of the energy storage component 14 over an SOC operating range for various OCV correction errors and times, in which a cell with an 8 Ah actual capacity was assumed to have an estimated 10 Ah capacity. For example, cross plot 110 represents a range of the SOC error 111 when the OCV correction error is ±1 percent and the duration between a starting SOC estimation and an ending SOC estimation is 1 hour. An abscissa 118 represents a difference in an SOC estimation between the starting SOC estimation and the ending SOC estimation in a proportional relationship to a maximum SOC of the energy storage component 14. That is, a point along the abscissa 118 that reads 0.5 represents a 50 percent increase in the SOC of the energy storage component 14 between the starting SOC measurement and the ending SOC measurement. Additionally, an ordinate 120 of the cross plot 110 represents a total SOC error where a total SOC error of one represents the total SOC error of 100 percent. As evidenced from the range of the SOC error 111, the bigger the range of the SOC measurements (i.e., the further away from zero along the abscissa 118), the greater the total SOC error. Accordingly, the cross plot 110 may indicate that a small range of the SOC measurements produces an SOC estimation with a greater accuracy.

Additionally, cross plot 112 represents a range of the SOC error 113 when the OCV correction error is ±1 percent and the duration between a starting SOC estimation and an ending SOC estimation is 24 hours. The abscissa 118 represents the difference in the SOC estimation between the starting SOC estimation and the ending SOC estimation in a proportional relationship to the maximum SOC of the energy storage component 14. Additionally, the ordinate 120 of the cross plot 112 represents the total SOC error. As evidenced from the range of the SOC error 113, the bigger the range of the SOC measurements (i.e., the further away from zero along the abscissa 118), the greater the total SOC error. Accordingly, the cross plot 112 may indicate that a small range of the SOC measurements produces an SOC estimation with a greater accuracy even over a longer period of time. Further, the SOC error 113 illustrates the effect of current offset error on the SOC error 113 over an extended duration between SOC estimations. For example, a distance 122 represents the effect of the current offset error on the SOC error 113 over an extended period of time in relation to the SOC error 111.

Further, cross plot 114 represents a range of the SOC error 115 when the OCV correction error is ±5 percent and the duration between a starting SOC estimation and an ending SOC estimation is 1 hour. The abscissa 118 represents the difference in the SOC estimation between the starting SOC estimation and the ending SOC estimation in a proportional relationship to a maximum SOC of the energy storage component 14. Additionally, an ordinate 120 of the cross plot 114 represents the total SOC error. As evidenced from the range of the SOC error 115, the bigger the range of the SOC measurements (i.e., the further away from zero along the abscissa 118), the greater the total SOC error. Additionally, it may be appreciated that a width of the SOC error 115 represents all the likely total SOC errors if the OCV correction error is randomly distributed (normal distribution) with a=/−5 percent error. Accordingly, the cross plot 114 may indicate that a small range of the SOC measurements produces an SOC estimation with a greater accuracy.

Furthermore, cross plot 116 represents a range of the SOC error 117 when the OCV correction error is ±5 percent and the duration between a starting SOC estimation and an ending SOC estimation is 24 hours. The abscissa 118 represents the difference in the SOC estimation between the starting SOC estimation and the ending SOC estimation in a proportional relationship to the maximum SOC of the energy storage component 14. Additionally, the ordinate 120 of the cross plot 112 represents the total SOC error. As evidenced from the range of the SOC error 117, the bigger the range of the SOC measurements (i.e., the further away from zero along the abscissa 118), the greater the total SOC error. Accordingly, the cross plot 112 may indicate that a small range of the SOC measurements produces an SOC estimation with a greater accuracy even over a longer period of time. The width of the SOC error 117 indicates all the likely total SOC errors if the OCV correction error is randomly distributed (normal distribution) with a=/−5 percent error. Further, the SOC error 117 illustrates the effect of current offset error on the SOC error 117 over an extended duration between SOC estimations. For example, a distance 124 represents the effect of the current offset error on the SOC error 117 over an extended period of time in relation to the SOC error 111.

With the foregoing in mind, FIG. 7 is a set of cross plots representing an estimated capacity of the energy storage component 14 over an SOC operating range for various SOC error values and times. For example, cross plot 126 represents an estimated capacity when the SOC error is ±1 percent and the duration between a starting SOC estimation and an ending SOC estimation is 1 hour. The abscissa 118 represents the difference in an SOC estimation between the starting SOC estimation and the ending SOC estimation in a proportional relationship to a maximum SOC of the energy storage component 14. That is, a point along the abscissa 118 that reads 0.5 represents a 50 percent increase in the SOC of the energy storage component 14 between the starting SOC measurement and the ending SOC measurement. Additionally, an ordinate 134 of the cross plot 126 represents an estimated capacity of the energy storage component 14 in ampere hours. As evidenced from the position of the data points in the cross plot 126, the bigger the range of the SOC measurements (i.e., the further away from zero along the abscissa 118), the more reliable the estimated capacity. For example, as the difference in the SOC estimation approaches positive 100 percent or negative 100 percent, the data points converge on an 8 Ah capacity of the energy storage component 14. However, when the difference in the SOC estimation is very small, the data points are scattered, which indicates that there is significant error in the capacity estimation. Accordingly, the cross plot 126 may indicate that a large range of the SOC measurements produces a capacity estimation with a greater accuracy.

Further, cross plot 128 represents an estimated capacity when the SOC error is ±1 percent and the duration between a starting SOC estimation and an ending SOC estimation is 24 hours. The abscissa 118 represents the difference in an SOC estimation between the starting SOC estimation and the ending SOC estimation in a proportional relationship to a maximum SOC of the energy storage component 14. Additionally, the ordinate 134 of the cross plot 126 represents an estimated capacity of the energy storage component 14 in ampere hours. As evidenced from the position of the data points in the cross plot 128, the bigger the range of the SOC measurements (i.e., the further away from zero along the abscissa 118), the more reliable the estimated capacity. For example, as the difference in the SOC estimation approaches positive 100 percent or negative 100 percent, the data points converge on an 8 Ah capacity of the energy storage component 14. However, when the difference in the SOC estimation is very small, the data points appear to diverge, which indicates that there is significant error in the capacity estimation. Accordingly, the cross plot 128 may indicate that a large range of the SOC measurements produces an SOC estimation with a greater accuracy.

Additionally, cross plot 130 represents an estimated capacity when the SOC error is ±5 percent and the duration between a starting SOC estimation and an ending SOC estimation is 1 hour. The abscissa 118 represents the difference in the SOC estimation between the starting SOC estimation and the ending SOC estimation in a proportional relationship to a maximum SOC of the energy storage component 14. Additionally, the ordinate 134 of the cross plot 126 represents the estimated capacity of the energy storage component 14 in ampere hours. As evidenced from the position of the data points in the cross plot 126, the increased SOC error may result in inaccurate capacity estimations even when the difference in the SOC estimation approaches positive 100 percent or negative 100 percent. Similarly, cross plot 132, which represents the estimated capacity when the SOC error is ±5 percent and the duration between the starting SOC estimation and an ending SOC estimation is 24 hours, indicates that the duration between SOC estimations does not benefit the accuracy of the capacity estimation. Accordingly, the cross plots 130 and 132 may indicate that an SOC error of ±5 percent results in unacceptable accuracy of the estimated capacity. However, it may be appreciated that while FIG. 7 depicts an SOC error of ±5 percent as beyond an acceptable accuracy threshold, batteries with different parameters may provide accurate capacity estimations when the SOC error is at or above ±5 percent.

With the foregoing in mind, it may be appreciated that a smaller difference in the SOC estimation over a shorter amount of time may result in a decreased SOC error, as shown in FIG. 6, but an larger difference in the SOC estimation over any amount of time may result in a more accurate capacity estimation, as shown in FIG. 7. Accordingly, the estimation logic module 64 may use calculated error values to determine when an SOC and/or SOH estimation is accurate. Moreover, the estimation logic module 64 may determine when to calculate estimated SOC and/or SOH values to minimize the resulting errors of the SOC and/or SOH values. For example, the estimation logic module 64 may calculate the estimated SOC and/or SOH values when there is a large difference in the SOC estimations within a short amount of time.

Turning now to FIG. 8, a flowchart of a method 140 that updates state of health and state of charge estimation values is illustrated. Initially, at block 142, the control module 32 is initialized to perform the method 140. During initialization, the control module 32 may receive instructions from the memory 36 that include the method 140, and the control module 32 may prepare the processor 34 to perform the instructions of the method 140.

Subsequently, at block 144, the control module 32 may instruct sensors 38 coupled to the energy storage component 14 to read battery data. The sensors 38 may include voltage sensors, current sensors, temperature sensors, or any other type of sensor that may enable the control module 32 to accurately estimate the state of health and/or the state of charge of the energy storage module 14. The variables measured by the sensors 38 may affect the SOC estimation accuracy.

At block 146, the control module 32 may estimate the SOC and the SOC error of the energy storage component 14 based on the battery data observed by the sensors at block 144. The SOC may be measured using a current integration technique, an OCV measurement technique, recursive algorithm techniques, or any other techniques that may provide an accurate estimation of the SOC of the energy storage component 14. Further, the SOC error may be determined based on the calculating error components that make up the SOC error 104 of FIG. 5. In some embodiments, the errors may be calculated directly from the specific method employed in the estimation. For example, some OCV methods may employ a recursive filters that may provide the error of the estimate. In other implementations the SOC errors may be obtained by calculating a difference between the estimates obtained from two different methods (e.g. a current integration technique and OCV measurement technique).

Calculation of the errors may also be based on knowledge of external factors. For example, the OCV measurement technique may present smaller errors when the energy storage component is close to equilibrium (e.g. no current in the energy storage component), and the current integration technique may present smaller errors when the depth of discharge is small.

Upon estimating the SOC and the SOC error, at decision block 148, a determination is made as to whether the SOC error is acceptable. That is, a predetermined error threshold may be established by the estimation logic 64 of the control module 32. When the SOC error does not exceed the predetermined error threshold, at block 150, the estimation logic 64 may update and output the current SOH and SOC values.

In contrast, if the SOC error exceeds the predetermined threshold, an error reducing operation may be performed at block 152. The error reducing operation may include estimating the SOC using different techniques, or updating the SOH of the energy storage component 14 to reduce the cell capacity error 100. In particular, when the SOH is inaccurate, the SOC error may be magnified by the SOH error. Accordingly, when the SOC error exceeds the predetermined error threshold, the estimation logic 64 may generate a new SOH estimation. Once the error reducing operation is completed at block 152, the battery data may be reread at block 144 and a new SOC estimation and SOC error may be estimated at block 146. Further, it may be appreciated that the error reducing operation may be repeatedly performed at block 152 until the SOC error reaches an acceptable rage. At such a time, the current SOH and SOC values may be updated at block 150.

One or more of the disclosed embodiments, alone or in combination, may provide one or more technical effects including determining a state of charge of the battery and determining a state of health of the battery. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery system, comprising:
   a battery configured to couple to an electrical system; and
   a battery control module comprising a state of charge (SoC) module and a state of health (SoH) module, wherein the battery control module is configured to electrically couple to the battery, and the battery control module is configured to:
   read battery data;
   estimate a first state of charge of the battery based at least in part on the battery data using a first method of the SoC module;
   calculate a first state of charge error of the battery associated with the estimate of the first state of charge and based on magnitudes of state of charge error sources associated with the first method;
   estimate a second state of charge of the battery based at least in part on the battery data using a second method of the SoH module;
   calculate a second state of charge error of the battery associated with the estimate of the second state of charge and based on magnitudes of state of charge error sources associated with the second method;
   estimate a third state of charge error of the battery based on the first and the second state of charge errors; and
   update a state of health estimation of the battery when the third state of charge error of the battery exceeds a predetermined threshold.

2. The battery system of claim 1, wherein the battery control module is configured to re-estimate the first state of charge of the battery based on the updated state of health estimation of the battery when the third state of charge error of the battery exceeds the predetermined threshold.

3. The battery system of claim 1, wherein the first method comprises a current integration method, an open circuit voltage measurement, or a recursive algorithm.

4. The battery system of claim 1, wherein the predetermined threshold comprises a state of charge error of 5 percent.

5. The battery system of claim 1, wherein an estimation logic module of the battery control module is configured to determine when the predetermined threshold is surpassed by the third state of charge error.

6. The battery system of claim 1, wherein when the third state of charge error exceeds the predetermined threshold, the SoH module is configured to perform an error reducing operation.

7. The battery system of claim 6, wherein the error reducing operation comprises limiting a duration between state of charge estimations.

8. The battery system of claim 6, wherein the battery control module is configured to repeatedly perform the error reducing operation until the first or the third state of charge error is below the predetermined threshold.

9. The battery system of claim 1, wherein the second state of charge error is determined based in part on an open circuit voltage correction error and the first state of charge error is determined based in part on a current integration error and a state of charge operating range.

10. The battery system of claim 1, wherein the battery data comprises battery voltage, battery current, and battery temperature.

11. The battery system of claim 1, wherein the battery control module is configured to update current values of the first state of charge, the second state of charge, or the state of health estimation, or any combination thereof, when the battery control module determines that the third state of charge error does not exceed the predetermined threshold.

12. The battery system of claim 11, wherein the battery control module is configured to update the current values of the first state of charge, the second state of charge, or the state of health, or any combination thereof, by displaying the current values of the first state of charge, the second state of charge, or the state of health of the battery, or any combination thereof on a display coupled to the electrical system.

13. A tangible, non-transitory computer readable medium of a battery control module configured to store instructions executable by a processor, wherein the instructions cause the processor to:
read battery data of a rechargeable battery;
estimate a first state of charge of the rechargeable battery based at least in part on the battery data read from the rechargeable battery;
determine a first state of charge error of the first state of charge based at least in part on magnitudes of first state of charge error sources;
estimate a second state of charge of the rechargeable battery based at least in part on the battery data read from the rechargeable battery, and a state of health of the rechargeable battery;
determine a second state of charge error of the second state of charge based at least in part on magnitudes of second state of charge error sources;
determine a third state of charge error based on the first state of charge error and the second state of charge error; and
update the state of health of the rechargeable battery when the third state of charge error exceeds a predetermined threshold.

14. The computer readable medium of claim 13, wherein the instructions cause the processor to estimate the first state of charge based on a recursive algorithm method, an open circuit voltage method, or a current integration method using the battery control module.

15. The computer readable medium of claim 13, wherein the first state of charge error sources comprise open circuit voltage correction errors and the second state of charge error sources comprise current integration errors.

16. The computer readable medium of claim 15, wherein the open circuit voltage correction errors comprise randomly distributed error sources and the current integration errors comprise time dependent state of charge error sources and depth of discharge bounded state of charge error sources.

17. The computer readable medium of claim 13, wherein the state of health is updated using a linear regression of the battery data comprising a real-time current and voltage, or the state of health is updated by monitoring an open circuit voltage of the rechargeable battery and consulting a look-up table.

18. The computer readable medium of claim 13, comprising instructions to cause the processor to control an estimation logic module of the battery control module of the rechargeable battery to determine when the predetermined threshold is surpassed by the third state of charge error.

19. The computer readable medium of claim 13, wherein the battery data comprises battery voltage, battery current, and battery temperature.

20. An energy storage system, comprising:
an electrical system of a vehicle or stationary battery;
an energy storage component configured to electrically couple to the electrical system of the vehicle or stationary battery;
at least one sensor coupled to the energy storage component and configured to collect energy storage component data from the energy storage component; and
a battery control module configured to:
estimate a first state of charge of the energy storage component based on the energy storage component data collected by the at least one sensor;
calculate a first state of charge error of the energy storage component based at least in part on magnitudes of first error sources associated with the first state of charge;
estimate a second state of charge of the energy storage component based on the energy storage component data calculated by the at least one sensor;
calculate a second state of charge error of the energy storage component based at least in part on magnitudes of second error sources associated with the second state of charge; and
update a state of health estimation of the energy storage component when a third state of charge error of the energy storage component exceeds a predetermined threshold, wherein the third state of charge error is calculated based on the first state of charge error and the second state of charge error.

21. The energy storage system of claim 20, wherein the energy storage component data comprises voltage, current, and temperature.

22. The energy storage system of claim 20, wherein the first error sources comprise open circuit voltage correction errors and the second error sources comprise current integration errors.

23. The energy storage system of claim 20, wherein the battery control module comprises an estimation logic module configured to determine when the predetermined threshold is surpassed by the third state of charge error.

* * * * *